United States Patent
Huang et al.

(10) Patent No.: US 10,832,999 B2
(45) Date of Patent: *Nov. 10, 2020

(54) PACKAGING METHODS FOR SEMICONDUCTOR DEVICES COMPRISING FORMING TRENCHES IN SEPARATION REGIONS BETWEEN ADJACENT PACKAGING SUBSTRATES

(71) Applicant: Taiwan Semiconductor Manufacturing Company, Ltd., Hsinchu (TW)

(72) Inventors: Kuei-Wei Huang, Hsinchu (TW); Wei-Hung Lin, Xinfeng Township (TW); Chih-Wei Lin, Zhubei (TW); Chun-Cheng Lin, New Taipei (TW); Meng-Tse Chen, Changzhi Township (TW); Ming-Da Cheng, Taoyuan (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/727,126

(22) Filed: Dec. 26, 2019

(65) Prior Publication Data

US 2020/0144171 A1 May 7, 2020

Related U.S. Application Data

(63) Continuation of application No. 13/276,143, filed on Oct. 18, 2011, now Pat. No. 10,522,452.

(51) Int. Cl.
*H01L 23/498* (2006.01)
*H01L 21/56* (2006.01)
(Continued)

(52) U.S. Cl.
CPC ...... *H01L 23/49827* (2013.01); *H01L 21/561* (2013.01); *H01L 23/13* (2013.01); *H01L 23/49822* (2013.01); *H01L 23/49894* (2013.01); *H01L 24/97* (2013.01); *H01L 23/3128* (2013.01); *H01L 24/13* (2013.01); *H01L 24/16* (2013.01); *H01L 24/81* (2013.01); *H01L 2224/13023* (2013.01); *H01L 2224/13082* (2013.01); *H01L 2224/13111* (2013.01);
(Continued)

(58) Field of Classification Search
CPC ......... H01L 23/49827; H01L 23/49822; H01L 23/49894; H01L 21/561; H01L 24/97
USPC .......... 257/773, E21.499, E21.502, E23.116; 438/113, 127
See application file for complete search history.

(56) References Cited

U.S. PATENT DOCUMENTS 10,522,452 B2 * 12/2019 Huang .............. H01L 23/49827
2001/0022392 A1 9/2001 Kresge et al.
(Continued)

FOREIGN PATENT DOCUMENTS

CN 102412360 A 4/2012

*Primary Examiner* — Matthew E. Gordon
(74) *Attorney, Agent, or Firm* — Slater Matsil, LLP

(57) ABSTRACT

Packaging methods for semiconductor devices are disclosed. A method of packaging a semiconductor device includes providing a workpiece including a plurality of packaging substrates. A portion of the workpiece is removed between the plurality of packaging substrates. A die is attached to each of the plurality of packaging substrates.

20 Claims, 7 Drawing Sheets

(51) Int. Cl.
*H01L 23/13* (2006.01)
*H01L 23/00* (2006.01)
*H01L 23/31* (2006.01)

(52) U.S. Cl.
CPC ........... *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/16237* (2013.01); *H01L 2224/2919* (2013.01); *H01L 2224/32225* (2013.01); *H01L 2224/73204* (2013.01); *H01L 2224/81191* (2013.01); *H01L 2224/81203* (2013.01); *H01L 2224/81815* (2013.01); *H01L 2224/97* (2013.01); *H01L 2924/12042* (2013.01); *H01L 2924/15311* (2013.01); *H01L 2924/181* (2013.01); *H01L 2924/351* (2013.01)

(56) References Cited

U.S. PATENT DOCUMENTS

| | | |
|---|---|---|
| 2007/0246821 A1 | 10/2007 | Lu et al. |
| 2008/0081407 A1 | 4/2008 | Oh et al. |
| 2008/0258278 A1* | 10/2008 | Ramos .............. H01L 23/49582 257/676 |
| 2010/0001377 A1 | 1/2010 | Kato et al. |
| 2010/0258921 A1 | 10/2010 | Chang Chien et al. |
| 2011/0212574 A1 | 9/2011 | Sekiya et al. |
| 2011/0233786 A1 | 9/2011 | Homma et al. |
| 2012/0061822 A1 | 3/2012 | Pagaila |
| 2012/0280390 A1 | 11/2012 | Do et al. |

\* cited by examiner

PACKAGING METHODS FOR SEMICONDUCTOR DEVICES COMPRISING FORMING TRENCHES IN SEPARATION REGIONS BETWEEN ADJACENT PACKAGING SUBSTRATES

PRIORITY CLAIM AND CROSS-REFERENCE

This application is a continuation and claims the benefit of U.S. application Ser. No. 13/276,143, filed on Oct. 18, 2011, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip (FC) ball grid array (BGA) package, in which semiconductor die are placed upside-down on a substrate and bonded to the substrate using micro-bumps. The substrate has wiring routed to connect the micro-bumps on the die to contact pads on the substrate that have a larger footprint. An array of solder balls is formed on the opposite side of the substrate and is used to electrically connect the packaged die to an end application.

However, some FC-BGA packages tend to exhibit bending, where warping of the substrate occurs during processing due to temperature stress, such as in solder flow processes which can have temperature ranges from about 240 to 260 degrees C. The warping results from coefficient of thermal expansion (CTE) mismatches in various material layers and components of the package and die. The substrate expansion is typically larger than that of the die, for example. Such warping and bending can cause reliability issues, lower assembly yields, bond breakage or shorts, and cold joints of the micro-bumps. Warpage behavior is more of a problem with thin core package substrates and can range from convex warpage at room temperature to concave warpage at high temperature, for example.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1 through 3a show cross-sectional views of a method of packaging an integrated circuit die in accordance with an embodiment of the present disclosure, wherein a top portion of a workpiece is removed before dies are attached to packaging substrates;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related generally to semiconductor devices, and more particularly to the packaging of integrated circuits. Novel packaged semiconductor devices are disclosed, wherein a packaging substrate is thinned in perimeter regions prior to attaching dies, which reduces or eliminates warpage during packaging processes such as thermal cycling and solder reflow processes.

Figure 1:
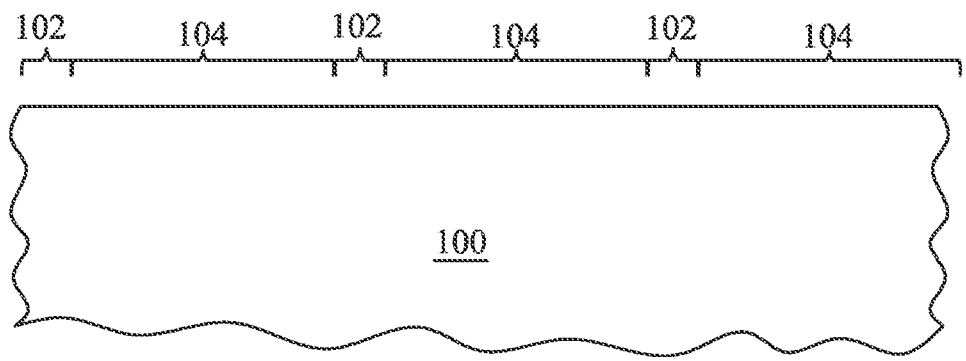

FIGS. 1 through 3a show cross-sectional views of a method of packaging integrated circuit dies 108 in accordance with an embodiment of the present disclosure, wherein a top portion of a workpiece 100 is removed before the dies 108 are attached to packaging substrates 104. First, a workpiece 100 is provided, as shown in FIG. 1. The workpiece 100 may comprise a ceramic, plastic, and/or organic material having a thickness of about 0.1 µm to about 0.5 µm, as examples, although alternatively, the workpiece 100 may comprise other materials and dimensions. The workpiece 100 comprises a plurality of packaging substrates 104 for the integrated circuit dies 108. Separation regions 102 are disposed between each packaging substrate 104 region, as shown. The separation regions 102 comprise regions where the packaging substrates 104 will be singulated or separated from one another at the end of the packaging process. The separation regions 102 may comprise singulation regions or scribe lines in some embodiments, for example. The packaging substrates 104 of the workpiece 100 may comprise substrates for flip-chip ball grid array (FC-BGA) packages, flip-chip chip scale packages (FC-CSP), land grid array (LGA) packages, or bond-on-trace (BOT) packages, as examples, although alternatively, other types of packaging substrates 104 may be used.

Figure 2:
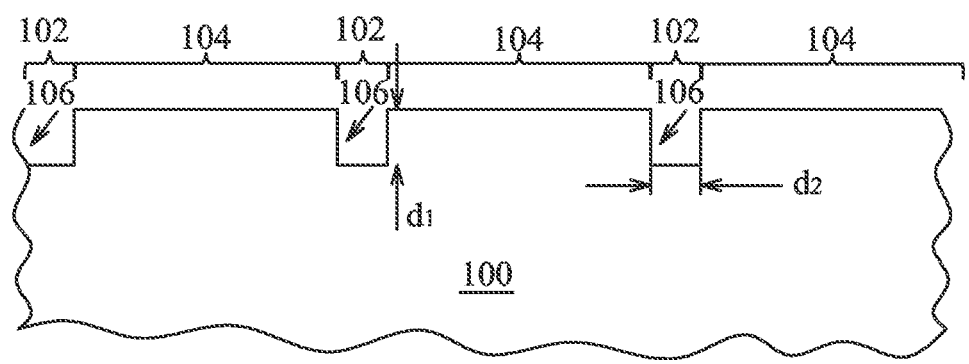

A top portion of the workpiece 100 is removed between the packaging substrates 104, as shown in FIG. 2. The top portion of the workpiece 100 is removed proximate or within the separation regions 102. The top portion removed may comprise recessed regions 106 having a depth comprising dimension $d_1$ beneath a top surface of the workpiece 100 and a width comprising dimension $d_2$. Dimension $d_1$ may comprise about 100 μm or less, and dimension $d_2$ may comprise about 20 μm or greater, for example, although alternatively, dimensions $d_1$ and $d_2$ may comprise other values.

In some embodiments, the top portion of the workpiece 100 is removed to create the recessed regions 106 using a laser or die saw. A partial cutting or scoring of the top portion of the workpiece 100 is implemented using such cutting devices, similar to a singulation process yet not completely scoring through the workpiece 100. Alternatively, the top portion of the workpiece 100 may be removed using a lithography process, by depositing a layer of photoresist (or a combination of a hard mask and a photoresist), patterning the layer of photoresist, and then using the layer of photoresist as an etch mask while the top portions of the workpiece 100 are etched away, for example.

Figure 3A:
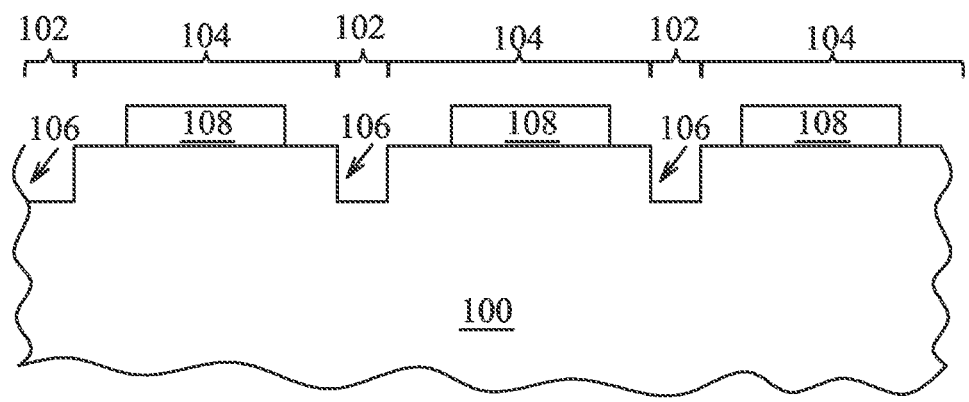

Referring next to FIG. 3a, a plurality of integrated circuit dies 108 is provided. The integrated circuit dies 108 may comprise a plurality of circuits and electrical components formed thereon, not shown. The integrated circuit dies 108 may have been previously fabricated on a semiconductor wafer (not shown) comprising a semiconductor material such as silicon or other semiconductors and singulated on scribe lines (similar to separation regions 102 of the workpiece 100) to form a plurality of single dies 108, for example. The integrated circuit dies 108 may comprise a shape of a square or rectangle in a top view (not shown in FIG. 3a; see FIG. 4). The integrated circuit dies 108 are also referred to herein as dies or semiconductor devices, for example. A plurality of dies 108 is coupled or attached to the plurality of packaging substrates 104 of the workpiece 100 in accordance with embodiments of the present disclosure.

In the embodiment shown in FIGS. 1 through 3a, a top portion of the workpiece 100 is removed between the packaging substrates. Alternatively, in other embodiments, a bottom portion of the workpiece 100 may be removed between the packaging substrates 104 in separation regions 102 creating recessed regions 106', as shown in FIG. 3b, before attaching the dies 108. The bottom portion of the workpiece 100 may be removed using similar techniques and having similar dimensions as described for the embodiment of FIGS. 1 through 3a, for example.

Figure 3B:
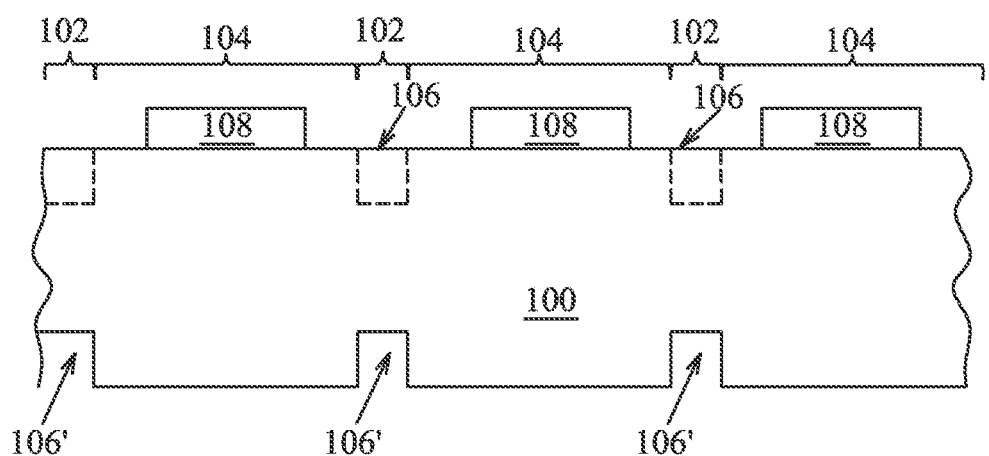
FIG. 3b shows a cross-sectional view of an embodiment wherein a bottom portion of a workpiece is removed.

In other embodiments, both a bottom portion and a top portion of the workpiece 100 may be removed, forming recessed regions 106 in the top portion of the workpiece, as shown in phantom in FIG. 3b, and forming recessed regions 106' in the bottom portion of the workpiece 100, as another example.

Figure 4:
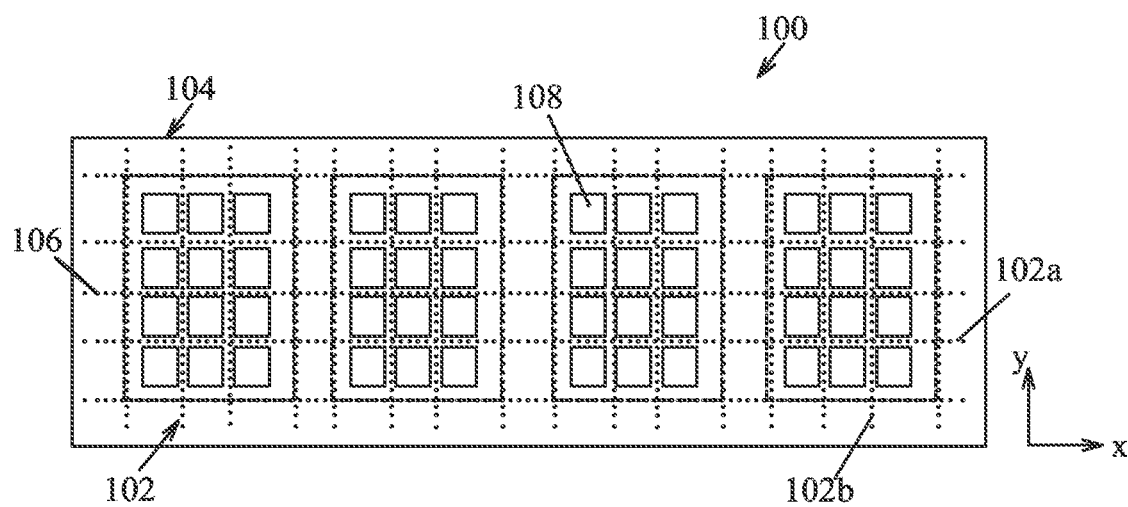
FIG. 4 shows a top view of a workpiece of FIG. 3a with dies attached thereto, illustrating separation regions between the dies where top portions of the workpiece are removed.

FIG. 4 shows a top view of a workpiece 100 of FIG. 3a. The workpiece 100 may be substantially rectangular in a top view, as shown, or the workpiece 100 may comprise other shapes. The plurality of dies 108 is coupled to the plurality of packaging substrates 104 which are arranged in an array-like structure of columns and rows on the workpiece 100. The separation regions 102 comprising the recessed regions 106 (and/or 106') reside between the packaging substrates 104 at the perimeters of the packaging substrates 104, proximate edges of the dies 108. The packaging substrates 104 may be arranged in groups in some embodiments, as shown, to provide unused areas on the workpiece 100 where a jig (not shown) may be implemented during a solder flow process to facilitate in positioning of the dies 108, for example.

The top and/or bottom portions of the workpiece 100 may be recessed in separation regions 102 that reside on the workpiece 100 in both an x-axis direction and also a y-axis direction in a top and/or bottom view of the workpiece 100 in some embodiments. In other embodiments, the top and/or bottom portions of the workpiece 100 may be recessed in the separation regions 102 only in an x-axis direction, as shown at 102a. In yet other embodiments, top or bottom portions of the workpiece 100 may be recessed in the separation regions 102 only in a y-axis direction, as shown at 102b. Combinations of removal in some x-axis directions and y-axis directions along the separation regions 102a and/or 102b on the top and/or bottom of the workpiece 100 may also be performed before the dies 108 are attached to the workpiece 100, for example.

In some embodiments, a top portion of the workpiece 100 may be removed in the x axis direction separation regions 102a, and a bottom portion of the workpiece 100 may be removed in the y axis direction separation regions 102b. In other embodiments, a top portion of the workpiece 100 may be removed in the y axis direction separation regions 102b, and a bottom portion of the workpiece 100 may be removed in the x axis direction separation regions 102a, as another example.

Removing the top portions and/or bottom portions of the workpiece 100 to form the recessed regions 106 and/or 106' in the separation regions 102 prior to attaching the dies 108 to the packaging substrates 104 is advantageous in that mechanical stress is reduced during subsequent processes that the workpiece 100 is exposed to, such as thermal processes that may require a high temperature. The recessed regions 106 and/or 106' reduce or eliminate warpage, providing warpage behavior control.

FIGS. 5 through 9 illustrate a method of packaging an integrated circuit die 108 in accordance with another embodiment Like numerals are used for the various elements in FIGS. 5 through 9 (and also in FIGS. 10 through 12) that were used to describe FIGS. 1, 2, 3a, 3b, and 4, and to avoid repetition, each reference number shown in FIGS. 5 through 9 is not described again in detail herein.

Figure 5:
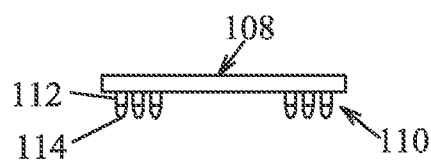
FIGS. 5 through 9 show cross-sectional and perspective (in FIG. 7) views of a method of packaging an integrated circuit die in accordance with another embodiment.

FIG. 5 shows a more detailed cross-sectional view of an integrated circuit die 108. Only one die 108 is shown in FIGS. 5 through 9 (and also in FIGS. 10 and 11); however, a plurality of integrated circuit dies 108 is packaged across a surface of a workpiece 100, as described and shown in the previous embodiments. The integrated circuit die 108 includes a plurality of bumps 110 formed on a surface thereof. In some embodiments, the bumps 110 comprise micro-bumps, for example. The bumps 110 are formed in a peripheral region of the die 108 and may be arranged in one or more rows in the peripheral region. As an example, the bumps 110 are arranged in three rows on each side of the integrated circuit die 108 in FIGS. 5 through 9, along a die edge or corners. The bumps 110 may alternatively be arranged in other patterns and may be positioned in other locations. Other embodiments may utilize aspects with bump structures along interior portions of the die, for example. The placement of the bump structures are provided for illustrative purposes only and the specific locations and patterns of the bump structures may vary and may include, as examples, an array of bumps, lines of bumps in a middle region of the die 108, or staggered bumps. The illustrated die 108 and bump 110 sizes and placement are provided for reference only and are not intended to be actual sizes or actual relative sizes.

Each bump 110 may include a metal stud 112 that may comprise copper, a copper alloy, or other metals, and solder 114 formed over the metal stud 112. The bumps 110 may alternatively comprise other materials. The metal studs 112 may be formed of any suitable conductive material, including Cu, Ni, Pt, Al, combinations thereof, and may be formed through any number of suitable techniques, including PVD, CVD, electrochemical deposition (ECD), molecular beam epitaxy (MBE), atomic layer deposition (ALD), electroplating, and the like. An optional conductive cap layer may be formed between the metal stud 112 and the solder 114, not shown. For example, in an embodiment in which the metal stud 112 is formed of copper, a conductive cap layer formed of nickel may be desirable. Other materials, such as Pt, Au, Ag, combinations thereof, or the like, may also be used. The solder 114 is formed over the metal stud 112 and/or the optional conductive cap layer. The solder 114 material may comprise SnPb, a high-Pb material, a Sn-based solder, a lead-free solder, or other suitable conductive materials, as examples. The bumps 110 may comprise a height (in a vertical direction in the drawings) of about 50 µm or less and a width of about 35 µm, for example, although the bumps may also comprise other dimensions.

The die 108 includes a workpiece comprising silicon or other semiconductive material. Insulating materials and conductive lines are formed over the workpiece (not shown). The conductive lines may be electrically coupled between the bumps 110 and electrical components of the workpiece of the die 108, for example. The conductive lines may comprise aluminum pads in some embodiments, for example, although other metals may be used. An under ball metallization (UBM) structure (not shown) may optionally be formed over the conductive lines of the die 108.

Figure 6:
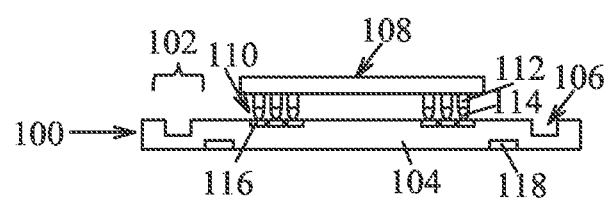

A workpiece 100 comprising a plurality of packaging substrates 104 is provided, as shown in FIG. 6 in a cross-sectional view. Only one packaging substrate 104 is shown in FIGS. 6 through 9; a plurality of packaging substrates 104 are formed over a surface of the workpiece 100, as shown in the previous embodiment. The workpiece 100 includes recessed regions 106 comprising a partial scoring or removal of a portion of the top surface in the separation regions 102, as described with reference to the embodiment shown in FIGS. 1, 2, 3a, 3b, and 4. Note that in the embodiment shown in FIGS. 5 through 9, a bottom portion of the workpiece 100 may also alternatively or additionally be removed to form recessed regions 106' (not shown in FIG. 6), as shown and described with respect to FIG. 3b.

A plurality of bond pads 116 is disposed on the top surface of the packaging substrate 104. The bond pads 116 are adapted to be coupled to the bumps 110 of the integrated circuit die 108 and comprise a similar pattern. A plurality of contact pads 118 is disposed on the bottom surface of the packaging substrate 104 proximate the separation regions 102. The contact pads 118 are adapted to be coupled a plurality of solder balls 136 (not shown in FIG. 6; see FIG. 11).

Figure 7:
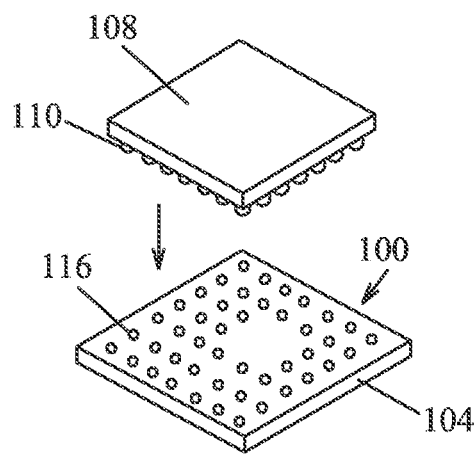

The die 108 is attached to the packaging substrate 104, as shown in a perspective view in FIG. 7, and a solder reflow process may be performed to reflow the solder 114 of the bumps 110 and electrically couple the die 108 to the package substrate 104. The die 108 may be attached to the packaging substrate 104 using an adhesive or by using a jig (not shown) to position the die 108 into place during the solder reflow process, in which case the solder 114 also functions as a mechanical attachment to the package substrate 104. The bumps 110 of the integrated circuit die 108 may be coupled to bond pads 116 of the packaging substrate 104 using a solder process, solder reflow process, and/or thermal compression bonding, as examples. Alternatively, other methods may be used to electrically connect the integrated circuit die 108 to the packaging substrate 104.

Figure 8:
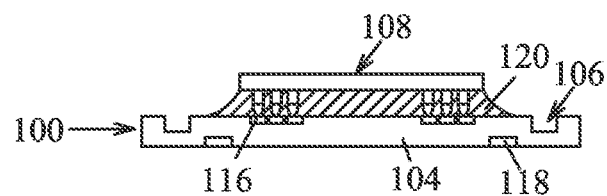
Figure 9:
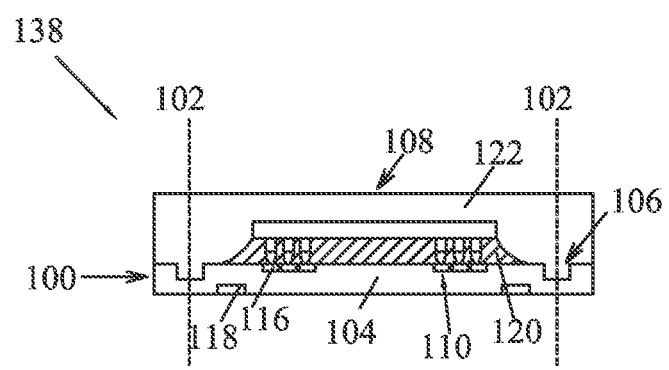

An optional under-fill material 120 may be formed over the integrated circuit die 108, as shown in FIG. 8 in a cross-sectional view. The under-fill material 120 may comprise a filler, an epoxy, a hardener, or multiple layers or combinations thereof, as examples, although alternatively, the under-fill material 120 may comprise other materials. A molding compound 122 is formed over the integrated circuit die 108, the under-fill material 120, and the packaging substrate 104, as shown in FIG. 9. The molding compound 122 may comprise an epoxy, a filler, an organic material, or multiple layers or combinations thereof, for example, although the molding compound 122 may also comprise other materials. The molding compound 122 may extend above a top surface of the integrated circuit die 108 by about 10 µm or greater, for example. If the integrated circuit die 108 is large, a greater amount of molding compound 122 may be used, to provide more robustness for the package, in some embodiments.

In some embodiments, a molding compound 122 may be formed over the integrated circuit die 108 without including the optional under-fill material 120, for example.

The packaged die 138 are then singulated at the separation regions 102, shown in phantom in FIG. 9, and the packaged dies 138 are separated from one another. The separation regions 102 may be disposed in a sacrificial area on the workpiece 100 in some embodiments, wherein functional portions of the packaged die 138 are not destroyed during the separation process. In other embodiments, sacrificial test circuitry (not shown) may be formed in the separation regions 102 which is destroyed during the separation process to separate the packaged die 138.

Figure 10:
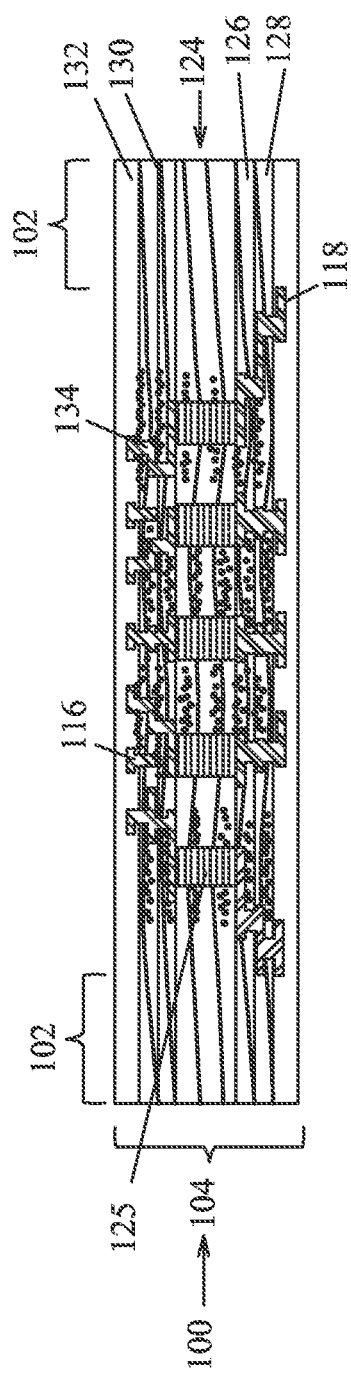
FIGS. 10 and 11 show cross-sectional views of a method of packaging an integrated circuit die in accordance with yet another embodiment.
Figure 11:
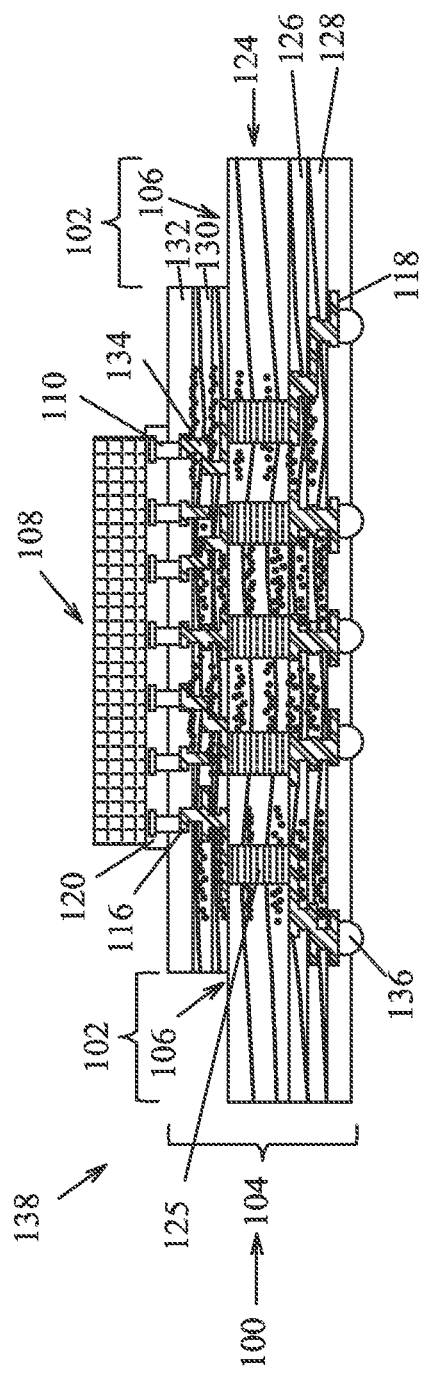

FIGS. 10 and 11 show cross-sectional views of a method of packaging an integrated circuit die 108 in accordance with yet another embodiment of the present disclosure. A more detailed view of a workpiece 100 and packaging substrate 104 is shown in this embodiment. A plurality of electrical connections comprising wiring 125, 128, and 134, contact pads 118, and bond pads 116 is disposed in the packaging substrate 104 within insulating materials 126, 124, and 130. The wiring 125, 128 and 124 is disposed between and electrically connects the plurality of contact pads 118 and the plurality of bond pads 116 of the packaging substrate 104. The electrical connections may comprise traces of electrical wiring 125, 128, and 134, contact pads 118, and bond pads 116 formed by lithography within the packaging substrate 104, for example. The electrical connections may comprise copper, aluminum, other metals, or multiple layers or combinations thereof, as examples. The plurality of electrical connections may comprise a redistribution layer (RDL) (not shown) formed in the packaging substrate 104, e.g., proximate a surface of the substrate 104 in some embodiments. The RDL may include fan-out regions of wiring. The integrated circuit die 108 may be electrically coupled to the RDL of the substrate 108. The packaging substrate 104 may include an optional UBM structure coupled to the RDL. The optional UBM may facilitate in coupling the solder balls 136 (see FIG. 11) to the packaging substrate 104, for example.

In this embodiment, the partial score or recessed regions 106 (and/or recessed regions 106', not shown; see FIG. 3b) of the packaging substrate 104 are formed in a solder mask 132 material and also in at least a portion of a dielectric material 130 disposed beneath the solder mask 132 material. The solder mask 132 material may comprise a commonly used solder mask material such as a polymer or other dielectric materials that do not react with solder, for example. The solder mask 132 may comprise a thickness of about a thickness of about 10 to 30 μm. The dielectric material 130 may comprise silicon dioxide, silicon nitride, a low dielectric constant (k) material, other insulating materials, or multiple layers or combinations thereof, as examples. The dielectric material 130 may comprise a thickness of about 100 μm or less. Alternatively, the solder mask 132 and the dielectric material 130 of the packaging substrate 104 may comprise other materials and dimensions.

FIG. 11 shows a cross-sectional view of a packaged semiconductor device 138 after solder balls 136 have been formed on contact pads 118 of the substrate 104. A molding compound 122 may then be formed over the packaged dies 138, and the packaged dies 138 may then be singulated (not shown in FIG. 11; see FIG. 9). The packaged semiconductor device 138 may then be attached using the solder balls 136 to another device, printed circuit board (PCB), or other end applications.

Figure 12:
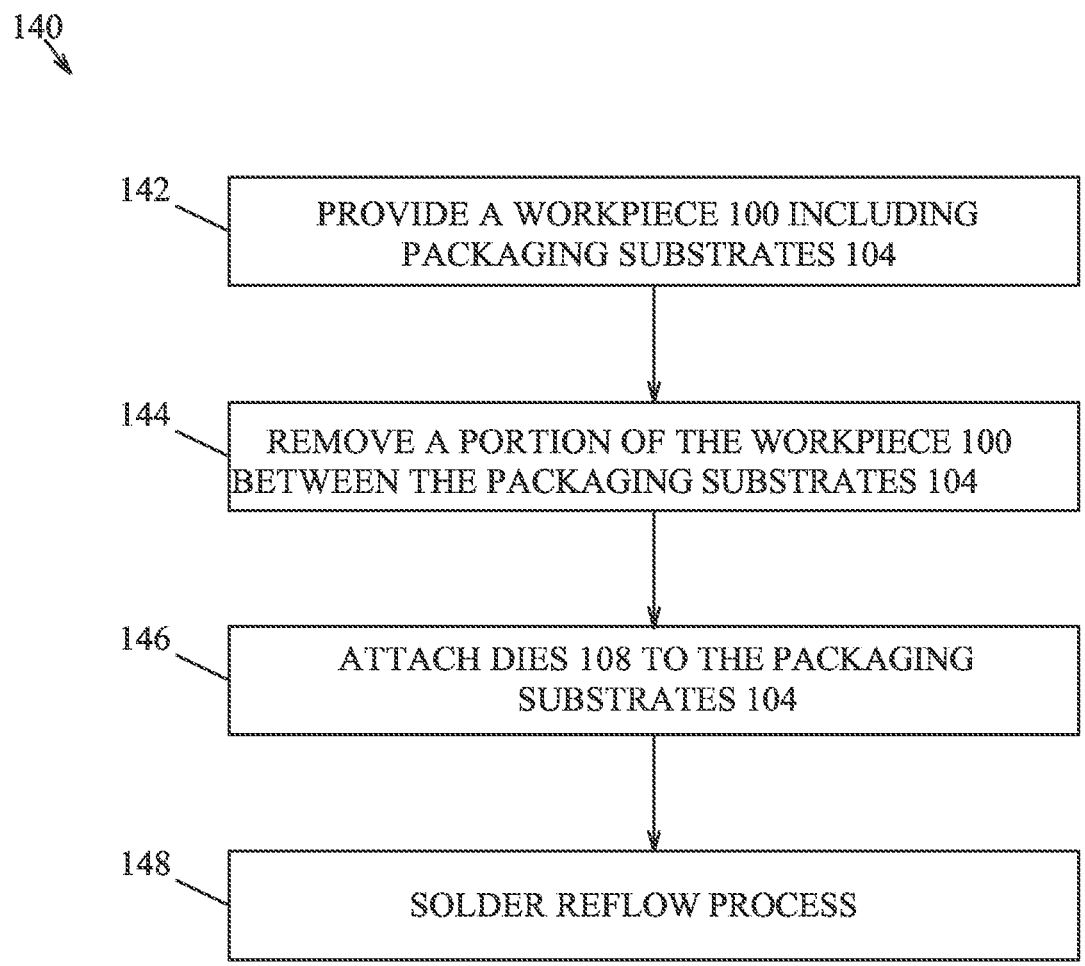
FIG. 12 is a flow chart illustrating a method of packaging a semiconductor device in accordance with embodiments described herein.

FIG. 12 is a flow chart 140 illustrating a method of packaging a semiconductor device in accordance with embodiments described herein. The method includes providing a workpiece 100 including a plurality of packaging substrates 104 (step 142). A portion of the workpiece 100 is removed between the packaging substrates 104 (step 144) to form recessed regions 106 in the separation regions 102. Dies 108 are attached to the packaging substrates 104 (step 146). A solder reflow process (step 148) or other means is then used to electrically couple the dies 108 to the packaging substrates 104.

Advantages of embodiments of the disclosure include providing novel packaging techniques that have increased reliability and higher yields due to the partial removal of the workpiece 102 before attaching the dies 108 to the packaging substrates 104. Warping and bending effects of the packaging substrates 104 and/or the dies 108 during thermal stress such as solder reflow processes are reduced or eliminated by embodiments of the disclosure described herein, due to the removal of the portion of the workpiece 102 in the separation regions 102 (e.g., forming recessed regions 106 and/or 106'). The recessed regions 106 and/or 106' reduce CTE mismatch and thermal expansion, and improve joint reliability. Cracks in connections of the bumps 110 and delaminations of the various material layers of the package (which may comprise low k material layers) are reduced or minimized, improving reliability. The novel packaging methods for semiconductor devices are easily implemented in manufacturing and packaging process flows.

In one embodiment, a method of packaging a semiconductor device includes providing a workpiece including a plurality of packaging substrates. A portion of the workpiece is removed between the plurality of packaging substrates. A die is attached to each of the plurality of packaging substrates.

In another embodiment, a method of packaging a semiconductor device includes providing a workpiece, the workpiece comprising a plurality of packaging substrates, forming a dielectric material over the workpiece, and forming a solder mask over the dielectric material. The method includes removing at least the solder mask between the plurality of packaging substrates, attaching a die to each of the plurality of packaging substrates, the die including a plurality of bumps disposed thereon, and electrically coupling the plurality of bumps of the die to the plurality of packaging substrates.

In yet another embodiment, a method of packaging a semiconductor device includes providing a workpiece comprising a plurality of packaging substrates, forming a dielectric material over the workpiece, forming a solder mask over the dielectric material, and removing the solder mask and at least a portion of the dielectric material between the plurality of packaging substrates on separation regions between the plurality of packaging substrates. The method includes attaching a die to each of the plurality of packaging substrates, the dies including a plurality of bumps disposed thereon, the plurality of bumps including solder, and reflowing the solder of the plurality of bumps of the dies using a solder reflow process. An under-fill material is formed on the dies, and a molding compound is formed over the dies, the under-fill material, and the plurality of packaging substrates. The plurality of packaging substrates is then singulated.

In yet another embodiment, a method includes forming a first packaging substrate and a second packaging substrate in a workpiece. A separation region is interposed between the first packaging substrate and the second packaging substrate. A top portion of the separation region is removed to form a top trench in the workpiece. A bottom portion of the separation region is removed to form a bottom trench in the workpiece. The top trench and the bottom trench are vertically aligned. At least a portion of the separation region is interposed between a bottom of the top trench and a bottom of the bottom trench. A die is bonded to each of the first packaging substrate and the second packaging substrate.

In yet another embodiment, a method includes forming a first packaging substrate and a second packaging substrate in a workpiece. A separation region is interposed between the first packaging substrate and the second packaging substrate. A solder mask is formed on a first surface of the workpiece. A plurality of contact pads are formed on a second surface of the workpiece. The second surface of the workpiece is opposite to the first surface of the workpiece. A portion of the solder mask and a portion of the separation region are removed to form a trench. Each of the plurality of contact pads is closer to the second surface of the workpiece than a bottom of the trench. A die is attached to each of the first packaging substrate and the second packaging substrate.

In yet another embodiment, a method includes forming a first packaging substrate and a second packaging substrate in a workpiece. A separation region is interposed between the first packaging substrate and the second packaging substrate. A dielectric material is formed on a first surface of the workpiece. A plurality of bond pads are formed over the dielectric material. A solder mask is formed over the plurality of bond pads and the dielectric material. A plurality of contact pads are formed on a second surface of the workpiece. The second surface of the workpiece is opposite to the first surface of the workpiece. After forming the plurality of contact pads, at least a portion of the solder mask is removed over the separation region to form a recess. Each of the plurality of contact pads is closer to the second surface of the workpiece than a bottom surface of the recess. After forming the recess, a die is bonded to each of the first packaging substrate and the second packaging substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a first packaging substrate and a second packaging substrate in a workpiece, wherein the workpiece comprises a ceramic material, a plastic material, or an organic material, and wherein a separation region is interposed between the first packaging substrate and the second packaging substrate;
removing a top portion of the separation region to form a top trench in the workpiece;
removing a bottom portion of the separation region to form a bottom trench in the workpiece, wherein the top trench and the bottom trench are vertically aligned, and wherein at least a portion of the separation region is interposed between a bottom of the top trench and a bottom of the bottom trench; and
bonding a die to each of the first packaging substrate and the second packaging substrate.

2. The method of claim 1, wherein the top trench extends into the workpiece to a first depth, and wherein the first depth is less than about 100 μm.

3. The method of claim 2, wherein the top trench has a width greater than about 20 μm.

4. The method of claim 1, wherein removing the top portion of the separation region comprises performing an etch process on the separation region.

5. The method of claim 1, wherein the top portion of the separation region is removed by a laser or a die saw.

6. The method of claim 1, further comprising forming a molding compound over the workpiece, wherein the molding compound fills the top trench.

7. The method of claim 1, further comprising performing a singulation process on the workpiece at the separation region.

8. A method comprising:
forming a first packaging substrate and a second packaging substrate in a workpiece, wherein a separation region is interposed between the first packaging substrate and the second packaging substrate;
forming a solder mask on a first surface of the workpiece;
forming a plurality of contact pads on a second surface of the workpiece, wherein the second surface of the workpiece is opposite to the first surface of the workpiece;
removing a portion of the solder mask and a portion of the separation region to form a trench, wherein each of the plurality of contact pads is closer to the second surface of the workpiece than a bottom of the trench; and
attaching a die to each of the first packaging substrate and the second packaging substrate.

9. The method of claim 8, wherein the solder mask is interposed between each of the first packaging substrate and the second packaging substrate and respective dies.

10. The method of claim 8, wherein removing the portion of the solder mask and the portion of the separation region comprises performing an etch process on the solder mask and the separation region.

11. The method of claim 8, wherein the portion of the solder mask and the portion of the separation region are removed by a laser or a die saw.

12. The method of claim 8, further comprising separating the first packaging substrate from the second packaging substrate at the separation region.

13. The method of claim 8, wherein the solder mask comprises a polymer.

14. The method of claim 8, wherein the solder mask has a thickness between about 10 μm and 30 μm.

15. A method comprising:
forming a first packaging substrate and a second packaging substrate in a workpiece, wherein a separation region is interposed between the first packaging substrate and the second packaging substrate;
forming a dielectric material on a first surface of the workpiece;
forming a plurality of bond pads over the dielectric material;
forming a solder mask over the plurality of bond pads and the dielectric material;
forming a plurality of contact pads on a second surface of the workpiece, wherein the second surface of the workpiece is opposite to the first surface of the workpiece;
after forming the plurality of contact pads, removing at least a portion of the solder mask over the separation region to form a recess, wherein each of the plurality of contact pads is closer to the second surface of the workpiece than a bottom surface of the recess; and
after forming the recess, bonding a die to each of the first packaging substrate and the second packaging substrate.

16. The method of claim 15, further comprising removing a portion of the dielectric material in the separation region.

17. The method of claim 15, further comprising forming a plurality of conductive structures in the workpiece, wherein the plurality of conductive structures electrically couple the plurality of bond pads to the plurality of contact pads.

18. The method of claim 15, further comprising singulating the first packaging substrate and the second packaging substrate at the separation region.

19. The method of claim 15, further comprising forming an under-fill material between the first packaging substrate and a respective die.

20. The method of claim 15, wherein the solder mask is in physical contact with the plurality of bond pads.

* * * * *